United States Patent
Sakurai

(10) Patent No.: US 9,027,822 B2
(45) Date of Patent: May 12, 2015

(54) MANUFACTURING METHOD OF SOLDER TRANSFER SUBSTRATE, SOLDER PRECOATING METHOD, AND SOLDER TRANSFER SUBSTRATE

(75) Inventor: Daisuke Sakurai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/822,708

(22) PCT Filed: Aug. 25, 2011

(86) PCT No.: PCT/JP2011/004731
§ 371 (c)(1),
(2), (4) Date: Mar. 13, 2013

(87) PCT Pub. No.: WO2012/063386
PCT Pub. Date: May 18, 2012

(65) Prior Publication Data
US 2013/0181041 A1    Jul. 18, 2013

(30) Foreign Application Priority Data

Nov. 8, 2010 (JP) ................................ 2010-249576

(51) Int. Cl.
| | |
|---|---|
| B23K 31/02 | (2006.01) |
| B23K 35/02 | (2006.01) |
| B23K 1/00 | (2006.01) |
| B23K 1/20 | (2006.01) |
| B23K 3/06 | (2006.01) |
| H01L 21/683 | (2006.01) |

(Continued)

(52) U.S. Cl.
CPC ..... *B23K 35/0244* (2013.01); *Y10T 428/24372* (2015.01); *B23K 1/0016* (2013.01); *B23K 1/203* (2013.01); *B23K 1/206* (2013.01); *B23K 3/0623* (2013.01); *B23K 2201/42* (2013.01); *H01L 21/6835* (2013.01); *H01L 24/11* (2013.01); *H01L 24/13* (2013.01);
(Continued)

(58) Field of Classification Search
CPC ........ H01L 21/00; H01L 21/02; H01L 21/64; H01L 21/67; H01L 21/70; H05K 1/00; H05K 3/007; H05K 3/0091; H05K 3/0094; H05K 3/02; H05K 3/10
USPC ............. 228/122.1, 123.1, 124.1, 124.5, 178, 228/179.1
See application file for complete search history.

(56) References Cited

U.S. PATENT DOCUMENTS

| | | |
|---|---|---|
| 5,591,037 A | 1/1997 | Jin et al. |
| 5,846,366 A | 12/1998 | Jin et al. |

(Continued)

FOREIGN PATENT DOCUMENTS

| | | |
|---|---|---|
| CN | 101084083 A | 12/2007 |
| CN | 101142665 A | 3/2008 |

(Continued)

OTHER PUBLICATIONS

International Search Report for Application No. PCT/JP2011/004731 dated Nov. 22, 2011.

(Continued)

*Primary Examiner* — Erin Saad
(74) *Attorney, Agent, or Firm* — RatnerPrestia

(57) ABSTRACT

An adhesive layer forming step of forming an adhesive layer on a surface of a substrate; a solder layer forming step of forming a solder layer on the adhesive layer by loading plural solder powders with in-between spaces; and a filler supplying step of supplying fillers to the in-between spaces of the solder powders that have been formed on the adhesive layer are included.

2 Claims, 9 Drawing Sheets

(51) Int. Cl.
*H01L 23/00* (2006.01)
*H05K 3/34* (2006.01)

(52) U.S. Cl.
CPC ............... *H01L 2224/11003* (2013.01); *H01L 2224/111* (2013.01); *H01L 2224/119* (2013.01); *H01L 2224/131* (2013.01); *H01L 2224/13144* (2013.01); *H01L 2224/13609* (2013.01); *H01L 2224/13611* (2013.01); *H01L 2924/01004* (2013.01); *H01L 2924/01013* (2013.01); *H01L 2924/01029* (2013.01); *H01L 2924/01079* (2013.01); *H01L 2924/014* (2013.01); H05K 3/3478 (2013.01); *H05K 2203/0338* (2013.01); *H05K 2203/0425* (2013.01); *H05K 2203/043* (2013.01); *H01L 2924/01005* (2013.01); *H01L 2924/01006* (2013.01); *H01L 2924/01019* (2013.01); *H01L 2924/01033* (2013.01); *H01L 2924/01327* (2013.01); *H01L 2224/11822* (2013.01); B23K 1/20 (2013.01); *H05K 2201/0209* (2013.01); *H01L 2224/11332* (2013.01); *H01L 2224/11849* (2013.01); *H01L 2224/13022* (2013.01); *H01L 2224/1357* (2013.01); *H01L 2224/94* (2013.01); *H01L 2224/1182* (2013.01); B23K 3/0607 (2013.01)

(56) References Cited

U.S. PATENT DOCUMENTS

| | | |
|---|---|---|
| 2008/0165518 A1 * | 7/2008 | Ichiryu et al. ............ 361/803 |
| 2008/0213613 A1 | 9/2008 | Kuramoto et al. |
| 2008/0284046 A1 | 11/2008 | Karashima et al. |
| 2009/0008776 A1 | 1/2009 | Kitae et al. |
| 2009/0117688 A1 | 5/2009 | Karashima et al. |
| 2011/0297433 A1 | 12/2011 | Kuramoto et al. |

FOREIGN PATENT DOCUMENTS

| | | |
|---|---|---|
| CN | 101395976 A | 3/2009 |
| CN | 100533701 C | 8/2009 |
| JP | 05-074846 A | 3/1993 |
| JP | 05-075250 A | 3/1993 |
| JP | 05-198933 A | 8/1993 |
| JP | 07-094853 A | 4/1995 |
| JP | 09-055578 A | 2/1997 |
| JP | 10-233463 A | 9/1998 |
| JP | 2000-094179 A | 4/2000 |
| JP | 2005-011884 A | 1/2005 |
| JP | 2009-010302 A | 1/2009 |
| KR | 10-2009-0004883 | 1/2009 |
| WO | WO 2006/067827 A1 | 6/2006 |
| WO | WO 2007/099866 A1 | 9/2007 |
| WO | WO 2010/093031 A1 | 8/2010 |

OTHER PUBLICATIONS

Korean Office Action for Application No. KR 10-2013-7008045, dated Jun. 10, 2014.

CN Search Report for 2011800508827, Nov. 26, 2014, Panasonic Corporation.

CN Office Action for 2011800508827, Nov. 26, 2014, Panasonic Corporation.

* cited by examiner

MANUFACTURING METHOD OF SOLDER TRANSFER SUBSTRATE, SOLDER PRECOATING METHOD, AND SOLDER TRANSFER SUBSTRATE

CROSS-REFERENCE TO RELATED APPLICATIONS

This application is a U.S. national phase application of PCT International Patent Application No. PCT/JP2011/004731 filed Aug. 25, 2011, claiming the benefit of priority of Japanese Patent Application No. 2010-249576 filed Nov. 8, 2010, all of which are incorporated by reference herein in their entirety.

TECHNICAL FIELD

The present invention relates to a manufacturing method of a solder transfer substrate, a solder precoating method and a solder transfer substrate.

BACKGROUND ART

In recent years, to further cope with both high density of a semiconductor element and high pin count of electrode terminals, narrow pitch and area reduction of electrode terminals of a semiconductor element have been aimed for.

Usually, in flip-chip mounting, mounting is carried out by forming protruding electrodes such as solder bumps and the like on the electrode terminals of a semiconductor element such as an LSI and the like, melting the solder layers formed beforehand on the terminals through pressing with heating of the semiconductor element turned face down against the connection terminals of the mounting board, and allowing connection to be carried out.

But, since the progress for narrow pitch is remarkable, when one line or two lines of the electrode terminals are arranged in the outer periphery part by a means in a staggered manner as conventionally, a short circuit may occur between the electrode terminals, and connection inferiority and the like may occur due to a difference in thermal expansion coefficients between the semiconductor element and the mounting board. Accordingly, a method of widening, by arranging the electrode terminals in the form of an area, the pitch between the electrode terminals has been taken, but the progress for narrow pitch becomes remarkable in recent years also in an area arrangement, and strict requirements are demanded also regarding the solder formation technique on the electrode terminals of a semiconductor element or a mounting board.

Conventionally, as a technique for solder formation onto electrode terminals, a plating method or a screen printing method, a ball mounting method and the like are used, but the plating method, which is suited for narrow pitch, has problems of productivity in that the step becomes complicated, and in that a facility line increases in size.

Moreover, it is difficult for the screen printing method or the ball mounting method, which is superior in productivity, to deal with narrow pitch since a mask is used.

In a situation like this, several techniques are proposed for selectively forming solder on the electrode terminals of an LSI element or the connection terminals of a circuit board in recent years (for example, see Japanese published patent application 2000-094179). These techniques, which are not only suited for formation of fine bumps but also superior in productivity since the solder layers can be formed en bloc, begin to be noticed.

As for the above mentioned techniques, in the technique proposed in Japanese published patent application 2000-094179, in the first place, a solder paste with a mixture of solder powders such that oxide films have been formed on the surfaces and a flux is applied to the whole area on the circuit board on which the connection terminals are formed. And, by heating the circuit board in that state, the solder powders are allowed to be melted, and the solder layers are allowed to be selectively formed on the connection terminals without causing short circuits between the contiguous connection terminals.

However, in this solder layer formation method, since the intervals between the electrode terminals are narrow, even if washing after the solder paste melting is performed, unmelted solder powders or flux components remain between the electrode terminals, and the problem is that, under a usage environment after the flip-chip mounting, bridge inferiority or migration inferiority occurs.

As a method of solving these problems, proposed is a solder formation technique of allowing solder powders to selectively attach onto the electrode terminals by superposing a support medium, to which the solder powders are attached, on a semiconductor element or a circuit board, and carrying out heating and pressurization (for example, see WO 2006/067827).

FIGS. 8(a)-(e) are explanatory drawings of the step of performing solder layer formation (precoating) in the embodiment proposed in WO 2006/067827. In what follows, that step is described.

In the first place, the adhesive 52 is applied to one side of the support medium 51 (FIG. 8(a)).

Next, the powder solders 53 are sprinkled on the adhesive 52, which has been applied to the support medium 51, to an extent such that the adhesive 52 is hidden (FIG. 8(b)).

After that, the powder solders 53 on the support medium 51 are raked smooth with the brush 54, and the redundant powder solders 53 that are not adhered to the adhesive 52 are removed (FIG. 8(c)).

On the other hand, the liquid flux 58 is applied, with the spray fluxer 57, to the face on which the soldering part 56 of the work 55 is formed (FIG. 8(d)).

Next, the flux application face of the work 55 and the powder solder adhesion face of the support medium 51 are superposed. At this time a pressure is exerted between the work 55 and the support medium 51 from above the support medium 51 with a pressing machine that is not shown. Then since the adhesive 52 has followability, the powder solders 53 that have been adhered to the adhesive 52 come into contact with the soldering part 56 when the pressure is exerted against the support medium 51 (FIG. 8(e)).

And, when the superposed work 55 and support medium 51 are heated and pressurized with a heating device that is not shown, the powder solders 53 are diffused at the interface with the soldering part 56 and joined thereto. And, after cooling, when the support medium 51 is removed from the work 55, the powder solders 53 that have been diffused at the interface with the soldering part 56 and joined thereto are left on the soldering part 56, and the powder solders 53 on the resist 59 are removed along with the support medium 51.

After that, the solder layers are formed on the electrode terminals by melting the powder solders 53 on the soldering part 56 with a reflow furnace.

By this solder layer formation method, solder can be formed also on the narrow-pitch electrode terminals and, without a complicated step with a large-sized facility line like electrolytic plating, production can be easily carried out with high productivity.

SUMMARY OF INVENTION

Problems to be Solved by Invention

However, when the solder formation technique of WO 2006/067827 as mentioned above is used for a semiconductor element with a low-dielectric-constant film used as the interlayer insulating film or a circuit board on which fragile electrode terminals are formed, the problem is that, while a solder transfer substrate (a solder attaching support medium) is peeled off, a low-dielectric-constant film or electrode pads peels off.

For the purpose of coping with a design rule becoming finer or high-speed signal processing that is required in recent years, a low-dielectric-constant film (so-called a low-k film, a ULK (Ultra Low-k) film or the like) has been used as the interlayer insulating film of a semiconductor element. A low-dielectric-constant film itself is allowed to be porous and have many empty holes of several nanometers for lowering the dielectric constant (the density for a low dielectric constant is 1.0-1.4 g/cm$^3$, for example).

FIGS. 9(a) and (b) show enlarged sectional views that conceptually show the step of forming solder layers, using the solder formation technique of WO 2006/067827 mentioned above, on such electrode terminals on a semiconductor element having a fragile low-dielectric-constant film.

As is shown in FIG. 9(a), in the step of pushing the solder powder attaching support medium (the solder transfer substrate 65) against the semiconductor element 66 having the protruding electrodes 68 and carrying out heating, the adhesive 62 and the protruding electrode 68 are bonded with each other.

Since the bonding strength between the adhesive 62 and the protruding electrodes 68 is more than the interface strength under the pads, the problem is that, as shown in FIG. 9(b), in the step of peeling off the solder transfer substrate 65, peeling-off from the fragile low-dielectric-constant film 67 under the pads is generated.

Moreover, in a case where the warp of the board at the time of mounting is large, it is necessary that the solder layers be formed thick so as to absorb the warp, and the solder transfer substrate be formed by spreading the solder powders 63 all over without in-between spaces so that contiguous powders come in contact with each other.

But, in this case, at the step of pushing the solder transfer substrate against the semiconductor element and carrying out heating, not only is the solder melted so that the solder and the protruding electrodes are diffused with each other, but also the contiguous whole solder is melted and diffused, and solidifies in a state where the solder on the protruding electrodes and the solder on the resist are continuous. On that account, in the step of peeling off the solder transfer substrate, the peeling-off is carried out at the solder/adhesive layer interface, the solder layers remain not only on the protruding electrodes but also on the resist, and the problem is that short-circuit inferiority occurs.

Moreover, also in a circuit board and the like such that electrode pads made of Cu, whose adhesion force with Si is weak, are formed on the circuit board made of silicon, in the case where the solder layers are allowed to be formed by using the solder formation technique of WO 2006/067827 mentioned above, similarly to the above-mentioned, while a solder transfer substrate is peeled off, fragile metal pads peel off from the circuit board.

An aspect of the present invention is, in view of the above-mentioned problems, to furnish a manufacturing method of a solder transfer substrate, a solder precoating method, and a solder transfer substrate that can surely form solder layers of appropriate thickness with respect to electronic components such as semiconductor elements and so forth or circuit boards having fragile portions.

Means of Solving Problem

In order to solve the problems described above, the 1$^{st}$ aspect of the present invention is a manufacturing method of a solder transfer substrate, comprising:

an adhesive layer forming step of forming an adhesive layer on a surface of a substrate;

a solder layer forming step of forming a solder layer on the adhesive layer by loading plural solder powders with in-between spaces; and a filler supplying step of supplying fillers to the in-between spaces of the solder powders.

Moreover, the 2$^{nd}$ aspect of the present invention is a manufacturing method of a solder transfer substrate, comprising:

an adhesive layer forming step of forming an adhesive layer on a surface of a substrate;

a solder layer forming step of forming a solder layer on the adhesive layer by loading plural solder powders with in-between spaces;

a flux supplying step of supplying a flux so that the solder powders are covered with the flux; and a filler supplying step of supplying fillers to the in-between spaces of the solder powders.

Moreover, the 3$^{rd}$ aspect of the present invention is a solder precoating method, comprising:

a solder joining step of superposing the solder transfer substrate that has been manufactured by the manufacturing method according to the 1$^{st}$ or 2$^{nd}$ aspect of the present invention, and a work that has a low-dielectric-constant layer with an electrode formed thereon so that a face on which the solder layer is formed faces a face on which the electrode is formed, and carrying out heating and pressurization, thereby allowing the solder powders to be diffused and joined to the electrode; and a transfer substrate peeling-off step of peeling off, after cooling, the solder transfer substrate from the work.

Moreover, the 4$^{th}$ aspect of the present invention is a solder transfer substrate, comprising:

a base layer;

an adhesive layer that is arranged on the base layer;

a solder layer with plural solder powders being, on the adhesive layer, arranged with in-between spaces; and fillers that are arranged in the in-between spaces of the solder powders.

Moreover, the 5$^{th}$ aspect of the present invention is the solder transfer substrate according to the 4$^{th}$ aspect of the present invention, wherein a particle diameter of the filler is smaller than a particle diameter of the solder powder.

Moreover, the 6$^{th}$ aspect of the present invention is the solder transfer substrate according to the 4$^{th}$ or 5$^{th}$ aspect of the present invention, wherein the filler is made of a material that does not get wet with respect to the solder powder.

Moreover, the 7$^{th}$ aspect of the present invention is the solder transfer substrate according to any of the 4$^{th}$-6$^{th}$ aspects of the present invention, wherein a layer of a flux is formed on the solder powders.

Moreover, the 8$^{th}$ aspect of the present invention is the solder transfer substrate according to any of the 4$^{th}$-7$^{th}$ aspects of the present invention, wherein the solder layer has a first region and a second region, and densities of the solder powders in the first region and the second region are different.

Moreover, the 9$^{th}$ aspect of the present invention is the solder transfer substrate according to any of the 4$^{th}$-8$^{th}$ aspects of the present invention, wherein a melting point of the filler is higher than a melting point of the solder powder.

Effects of Invention

By the present invention, a manufacturing method of a solder transfer substrate, a solder precoating method, and a solder transfer substrate can be furnished that can surely form solder layers of appropriate thickness with respect to electronic components such as semiconductor elements and so forth or circuit boards having fragile portions.

MODES FOR CARRYING OUT INVENTION

Figure 1A:
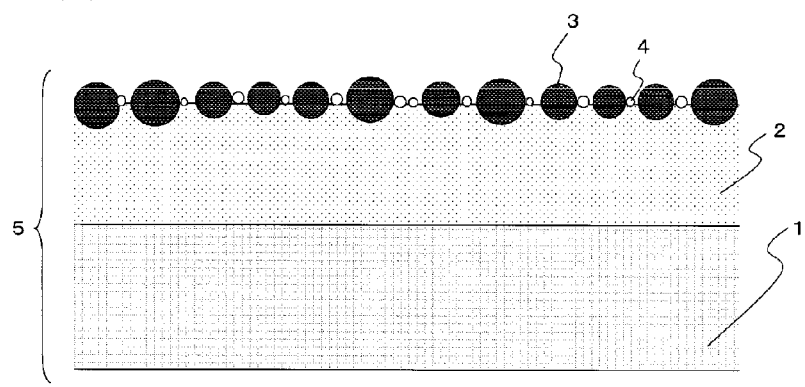
FIG. 1(a) is a sectional view that conceptually shows a solder transfer substrate in Embodiment 1 of the present invention.

In the following, embodiments of the present invention are described referring to the drawings.

Embodiment 1

FIGS. 1(a) and (b) are a sectional view and a plane view that conceptually show a solder transfer substrate in Embodiment 1 of the present invention.

Figure 1B:
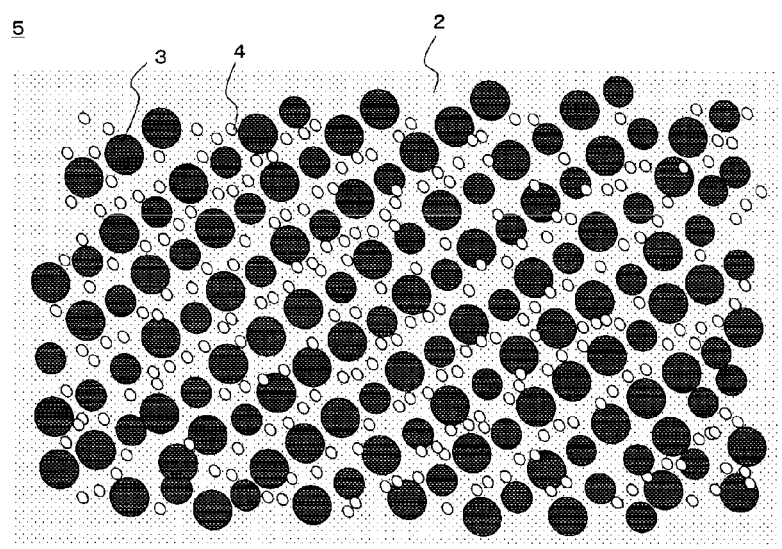
FIG. 1(b) is a plane view that conceptually shows a solder transfer substrate in Embodiment 1 of the present invention.

As is shown in FIG. 1(a), the solder transfer substrate 5 of present Embodiment 1 is constituted by the base layer 1, the adhesive layer 2 arranged on the base layer 1, a solder layer that is formed by the plural solder powders 3 that have been loaded so as to be bonded to the adhesive layer 2, and the fillers 4 arranged between the solder powders 3 of the solder layer that have been arranged on the adhesive layer 2 with in-between spaces between the contiguous solder powders 3. And, as is shown in FIG. 1(b), the fillers 4 are arranged in planar gaps between the solder powders 3 and on the adhesive layer 2.

The base layer 1 is, for example, made of a film substrate of polyethylene terephthalate, polyethylene naphthalate, a liquid-crystal polymer, a polyimide and the like, and one the thickness of which is 20-200 μm is used. By using a film substrate, in the transfer substrate peeling-off step, it becomes possible to carry out peeling-off with bending at free angles, the force that is applied to the positions right under the electrodes can be decreased, and under-pad interface peeling-off also with respect to a more fragile insulating film can be surely prevented.

The adhesive layer 2 is, for example, made of an adhesive of acrylic system, silicon system and the like. For the solder powders 3, SnAgCu, SnAgBiIn, SnZnBi, Sn, In, SnBi and the like may be used.

The thickness of the adhesive layer 2 can be set freely with respect to the diameter of the solder powder 3. For example, when the diameter of the solder powder 3 is 2-12 μm, the thickness of the adhesive layer 2 may be allowed to be 5-100 μm.

Moreover, it is desirable to choose, for the fillers 4, a substance such that at the time of solder melting, with respect to the fillers 4 the solder does not get wet and is also not caused to be diffused and joined thereto. For example, an inorganic filler of $Al_2O_3$, $SiO_2$, MgO and the like, a metal with thick oxide film of Al, Fe and the like, or a resin bead of acrylic and the like can be used. For example, when the filling rate of the solder powders is 70-80%, for the fillers 4, the diameter may be allowed to be 0.1-1.5 μm with the powder filling rate being 5-10%.

FIGS. 2(a)-(d) are sectional views that conceptually show a manufacturing method of the solder transfer substrate 5, in present Embodiment 1. In the following, a manufacturing method of the solder transfer substrate 5 is described using FIG. 2.

(1) The base layer 1 such as the above-described resin film and the like is prepared. Easy-bonding treatment for raising the bonding strength of the adhesive layer, such as corona treatment, plasma treatment, primer application and the like, may be given on the surface of the base layer 1 (FIG. 2(a)).

Figure 2A:
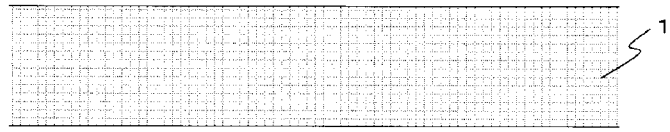
FIGS. 2(a)-(d) are sectional views that conceptually show a manufacturing method of the solder transfer substrate, in Embodiment 1 of the present invention.
Figure 2B:
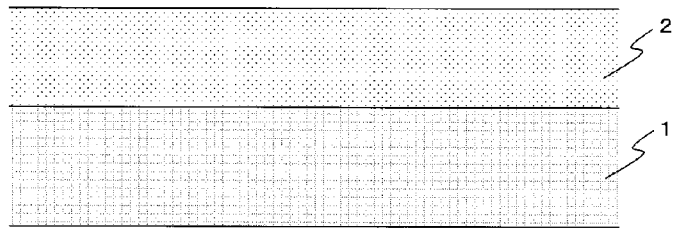
Figure 2C:
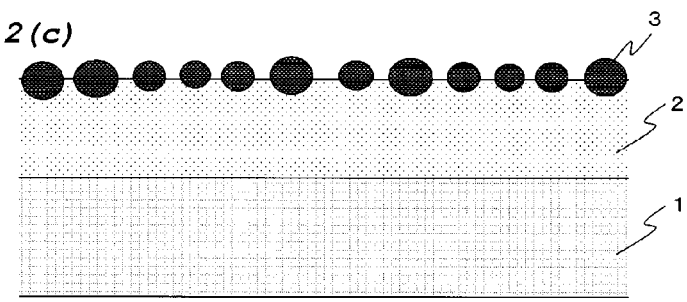
Figure 2D:
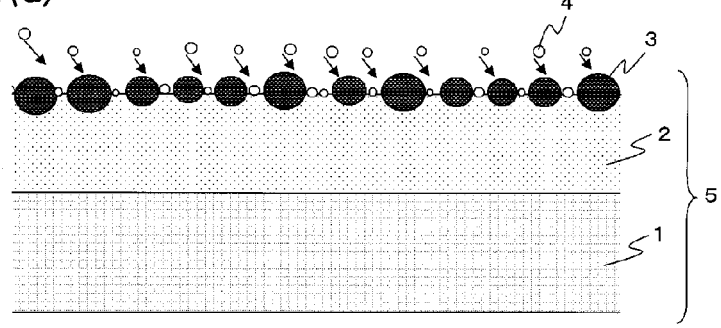
Figure 3A:
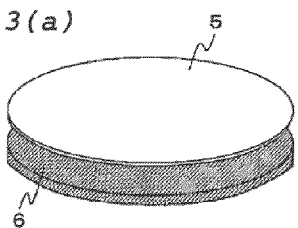
FIGS. 3(a)-(e) are sectional views and perspective views that conceptually show a manufacturing method of a semiconductor device using the solder transfer substrate, in Embodiment 1 of the present invention.
Figure 3A:
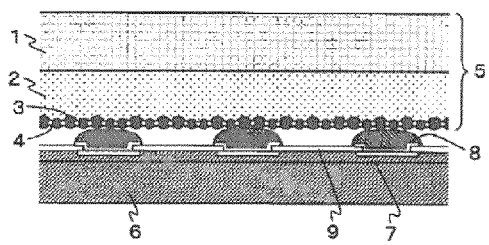
Figure 3B:
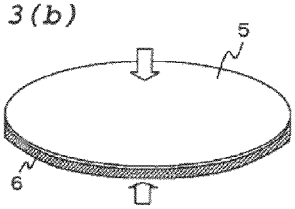
Figure 3B:
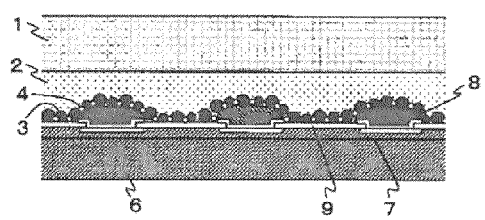
Figure 3C:
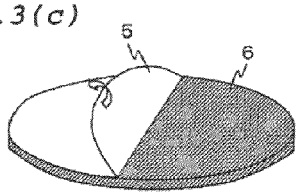
Figure 3C:
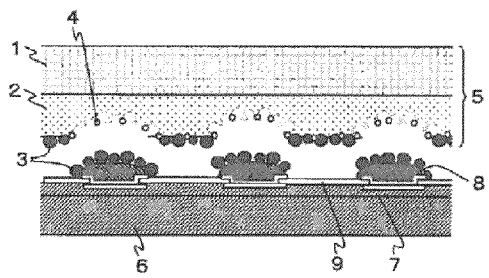
Figure 3D:
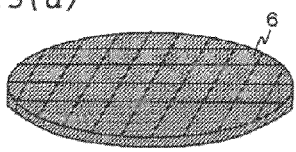
Figure 3D:
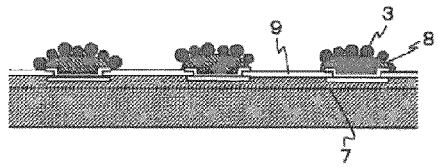
Figure 3E:
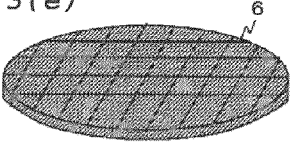
Figure 3E:
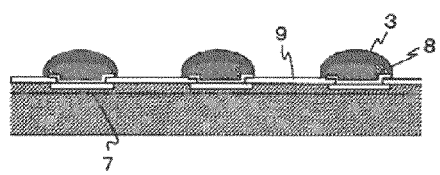

(2) The adhesive layer 2 is, on the base layer 1, formed by sticking of an adhesive film or coating of an adhesive (FIG. 2(b)). Further, this step corresponds to an example of the adhesive layer forming step of the present invention.

(3) The solder powders 3 are, from above the adhesive layer 2, sprinkled over, using a means such as a sieve, an air jet and the like and the solder powders 3 and the adhesive layer 2 are bonded. After that, in order to provide in-between spaces between the solder powders 3, by a means such as a brush, air or the like, the solder powders 3 of redundancy are removed (FIG. 2(c)). Further, this step corresponds to an example of the solder layer forming step of the present invention.

(4) Additionally, the fillers 4 are sprinkled over the solder powders 3, using a means such as a sieve, an air jet and the like. In this step, the minute fillers 4 get into the in-between spaces between the solder powders 3, and the fillers 4 and the adhesive layer 2 are bonded. Additionally, by an air jet and the like, the fillers 4 of redundancy that have attached onto the solder powders 3 are removed (FIG. 2(*d*)). Further, this step corresponds to an example of the filler supplying step of the present invention.

Through the aforementioned steps, the solder transfer substrate 5 of present Embodiment 1 is completed.

FIGS. 3(*a*)-(*e*) are sectional views that conceptually show a manufacturing method of a semiconductor device using the solder transfer substrate 5 in present Embodiment 1. Here, an example of allowing the solder to be formed on the electrodes of an semiconductor element in a state of being formed in a wafer and, on the left side of the sectional view of each of the steps shown in FIGS. 3(*a*)-(*e*) is shown each of the corresponding perspective views.

In the following, using FIG. 3 the manufacturing method of the semiconductor device of present Embodiment 1 is described.

As is shown in FIG. 3(*a*), the fragile low-dielectric-constant film (Extremely LowK) 7 is formed inside the semiconductor element 6, and the protruding electrodes 8 made of Au—Ni, for example, are formed on its outermost surface. Moreover, the portions of the surface of the semiconductor element 6 on which the protruding electrodes 8 are not formed are covered with the insulating film 9 of silicon nitride and the like, for example.

Further, the semiconductor element 6 that is now being allowed to be a target of the solder formation corresponds to an example of the work of the present invention.

In the first place, the face, on which the solder layers of the solder transfer substrate 5 have been formed, is overlaid so as to face the protruding electrodes 8, and heating, and pressurization is carried out.

Then, as is shown in FIG. 3(*b*), the adhesive layer 2 softens by heating and, as the solder powders 3 and the fillers 4 are getting buried into the adhesive layer 2, the solder powders 3 and the protruding electrodes 8 are diffused and joined to each other at the interface with the protruding electrodes 8. Since there is a space between each of the solder powders 3, and the adhesive layer 2 gets in between the solder powders 3, each of the solder powders 3 is thus not melted to get continuous with the adjacent ones.

The adhesive layer 2 that has softened is bonded via the fillers 4 with the portions on the protruding electrodes 8 to which the solder powders 3 are not joined. After that when cooled, the adhesive layer 2, which has gotten in between the solder powders 3 in the form of anchors and has been joined to the protruding electrodes 8, becomes in a state of being anchored.

Next, as is shown in FIG. 3(*c*), the solder transfer substrate 5 is peeled off. The solder powders 3 on the protruding electrodes 8 are, since joined thereto, left on the protruding electrodes 8. On the other hand, the solder powders 3 on the insulating film 9 outside the protruding electrodes 8 are, since the bonding strength between the solder and the adhesive (the adhesive layer 2) is more than the strength between the adhesive (the adhesive layer 2) and the insulating film 9, taken away to the adhesive layer 2 on the side of the solder transfer substrate 5. In this way, as is shown in FIG. 3(*d*), the solder powders 3 become in a state of being joined onto the protruding electrodes 8.

After this, a flux may be supplied to the surface with subsequent depositing in a reflow furnace, which is not shown, to allow the solder powders 3 to be completely melted. The solder, allowed to be melted, has a uniform height, and joining at the time of flip-chip mounting now can be surely carried out (FIG. 3(*e*)).

Now, the peeling-off step of the solder transfer substrate 5 is described in detail.

Figure 4A:
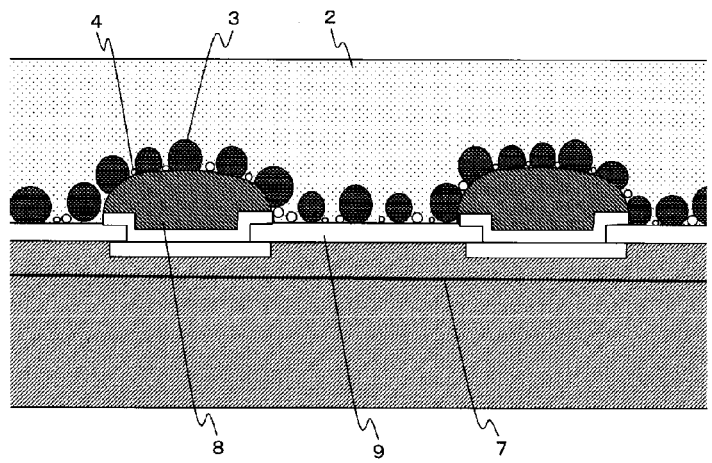
FIGS. 4(a) and (b) are enlarged sectional views that conceptually describe the peeling-off step of the solder transfer substrate, in Embodiment 1 of the present invention.
Figure 4B:
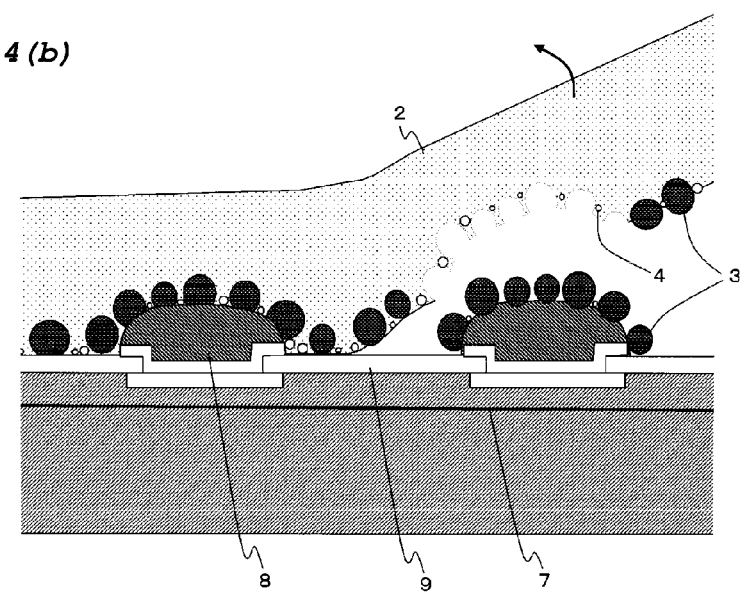
Figure 5A:
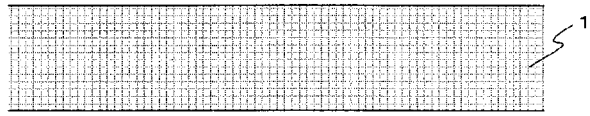
FIGS. 5(a)-(e) are sectional views that conceptually describe a manufacturing method of a solder transfer substrate and a solder transfer method using the solder transfer substrate, in Embodiment 2 of the present invention.
Figure 5B:
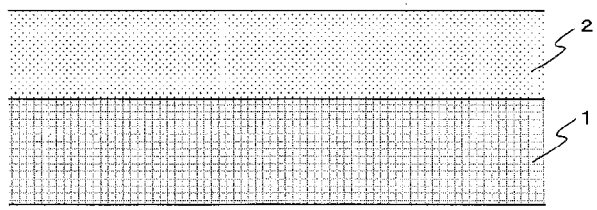
Figure 5C:
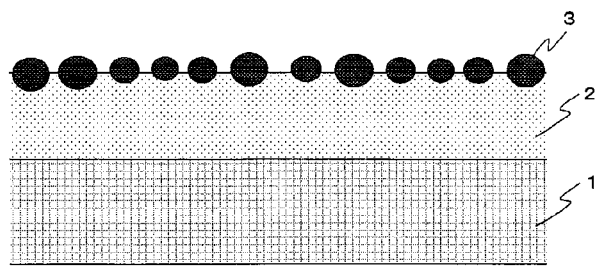
Figure 5D:
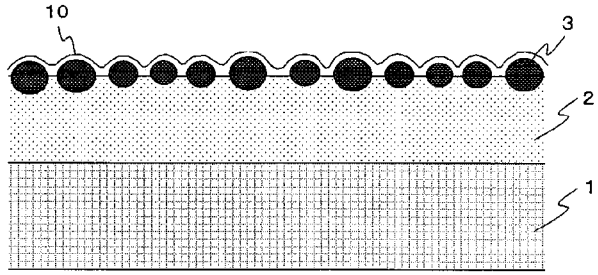
Figure 5E:
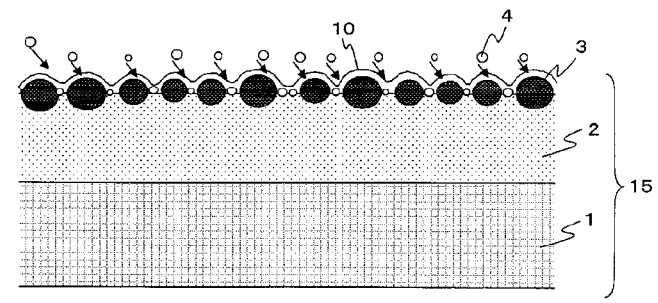

FIGS. 4(*a*) and (*b*) are enlarged views of the sectional views that conceptually describe the peeling-off step of the solder transfer substrate of present Embodiment 1.

As shown in FIG. 4(*a*), since, by carrying out filling of the gaps between the solder powders 3 on the solder transfer substrate 5 with the fillers 4, the area of the adhesive layer 2 bonding to the protruding electrodes 8 gets smaller, the bonding strength between the protruding electrodes 8 and the adhesive layer 2 is degraded. Now, since the bonding strength between the protruding electrodes 8 and the adhesive layer 2 is less than the under-pad interface strength, pad peeling-off or peeling-off and fissures of the low-dielectric-constant film 7 can be suppressed at the time of peeling-off of the solder transfer substrate 5.

Consequently, as shown in FIG. 4(*b*), in the step of peeling off the solder transfer substrate 5, the solder transfer substrate 5 can be, without peeling from the fragile low-dielectric-constant film 7, peeled off.

A result of measuring the interface strength between the solder transfer substrate 5 and the Au—Ni electrodes after melting of the solder powders 3 using 180 degree peel test method shows that, while it is 10N/25 mm in a case where no fillers are used as conventionally, it can be decreased to 2N/25 mm by present Embodiment 1.

Further, it is desirable that the particle diameter of the filler 4 be smaller than the particle diameter of the solder powder 3. It is because, in a case where the diameter of the filler 4 is larger than the diameter of the solder powder 3, the effect of lowering the interface strength between the solder transfer substrate 5 and the Au—Ni electrodes gets higher, but the transfer quantity to the protruding electrodes 8 gets smaller, and absorption of the warp at the time of mounting becomes difficult.

Further, after the transfer substrate peeling-off step shown in FIG. 3(*d*), washing may be carried out using pure water or an organic solvent such as ethanol, isopropylene alcohol, glycol ether and the like. By washing, the fillers 4 that have remained between the protruding electrodes 8 on the surface of the insulating film 9 can be surely removed, and a defect such as occurrence of solder cracks and the like because of their remaining on the solder joining part after mounting can be prevented. Yet, in a case where the diameter of the filler 4 is very small with respect to the solder powders 3 (for example, in a case of the filler diameter/the solder powder=1/20–1/10), since the physical property of the solder powders 3 is not influenced even if the fillers 4 get into the melted solder powders, they do not have to be removed.

Moreover, by carrying out filling with the fillers 4 also with respect to the solder transfer substrate 5 that has been densely filled with the solder powders 3, bridges of the contiguous solder powders 3 can be prevented and, moreover, since the bonding area of the adhesive layer 2 to the protruding electrodes 8 gets additionally smaller, along with a decrease of the interface strength between the solder transfer substrate 5 and the Au—Ni electrodes, the filler 4 becomes the initial point of the peeling-off, so that the effect of allowing the peeling to be still easier is generated. As for a solder transfer sheet that has been densely filled with solder powders, for example, the solder powder particle diameter of 10-20 μm, the solder powder filling rate of 80-85%, the filler diameter of 1-2 μm, and the filler filling rate of 5% can be used.

Moreover, it is desirable that the melting point of the filler 4 be higher than the melting point of the solder powder 3. It is because, when the melting point of the filler 4 is lower than the melting point of the solder powder 3, since the fillers 4 are melted with heating carried out while the solder powders 3 are diffused and joined to the protruding electrodes 8, the effect of decreasing the bonding strength between the protruding electrodes 8 and the adhesive layer 2 gets smaller.

As illustrated in the aforementioned, by the solder transfer substrate of present Embodiment 1, also in a semiconductor element having a fragile dielectric film, solder layers can be surely formed with no peeling-off and fissures of the fragile dielectric film caused.

Embodiment 2

FIGS. 5(*a*)-(*e*) are sectional views that conceptually describe a manufacturing method of a solder transfer substrate, and a solder transfer method using the solder transfer substrate, in Embodiment 2 of the present invention.

(1) The base layer 1 such as a resin film that has been described in Embodiment 1 and the like is prepared. Easy-bonding treatment for raising the bonding strength of the adhesive layer, such as corona treatment, plasma treatment, primer application and the like, may be given on the surface of the base layer 1 (FIG. 5(*a*)). For example, for the resin film, a polyimide the thickness of which is 20-50 μm is used.

(2) The adhesive layer 2 is, on the base layer 1, formed by using a means such as a bar coater, a spin coater, a dispenser, a spray and the like, or sticking an adhesive film using a laminater and the like (FIG. 5(*b*)). For example, the thickness of the adhesive layer 2 may be 10-30 μm. Further, this step corresponds to an example of the adhesive layer forming step of the present invention.

(3) The solder powders 3 are, from above the adhesive layer 2, sprinkled over, using a means such as a sieve, an air jet and the like, and the solder powders 3 and the adhesive layer 2 are bonded. After that, in order to provide in-between spaces between the solder powders 3, by a means such as a brush, air or the like, the solder powders 3 of redundancy are removed, and the solder layer is formed (FIG. 5(*c*)). For example, the solder powder 3, the particle diameter of which is 5-12 μm, is made with a composition of SnZnBi, Sn, SnBi, and SnAgCu. Further, this step corresponds to an example of the solder layer forming step of the present invention.

(4) Additionally, using a jet dispenser, a fluxer and the like, the flux 10 is applied to the whole area from above the solder powders 3, and a flux layer is formed (FIG. 5(*d*)). For example the flux layer may be of 5-15 μm. Further, this step corresponds to an example of the flux supplying step of the present invention.

(5) Additionally, the fillers 4 are sprinkled over on the flux layer, using a means such as a sieve, an air jet and the like. In this step, the minute fillers 4 get into the in-between spaces between the solder powders 3, and the fillers 4 and the adhesive layer 2 are bonded. Additionally, by an air jet and the like, the fillers 4 of redundancy that have attached onto the solder powders 3 are removed (FIG. 4(*e*)). As the filler 4, for example, an inorganic filler of $Al_2O_3$, $SiO_2$, MgO and the like, a metal with thick oxide film of Al, Fe and the like, or a resin bead of acrylic and the like can be used. For example, when the filling rate of the solder powders 3 is 60-70%, for the fillers 4, the diameter may be allowed to be 1-3 μm with the powder filling rate being 10-20%. Further, this step corresponds to an example of the filler supplying step of the present invention.

Through the aforementioned steps, the solder transfer substrate 15 of present Embodiment 2 is completed.

Figure 6A:
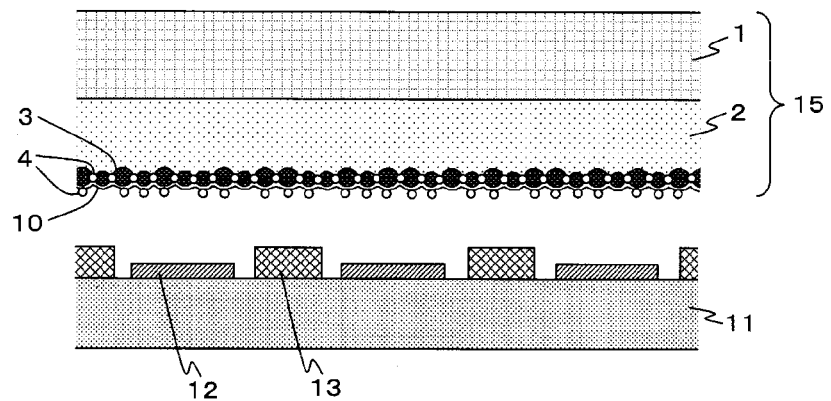
FIGS. 6(a)-(c) are sectional views that conceptually show a manufacturing method of a solder coating layer to the circuit board electrodes, using the solder transfer substrate of Embodiment 2 of the present invention.
Figure 6B:
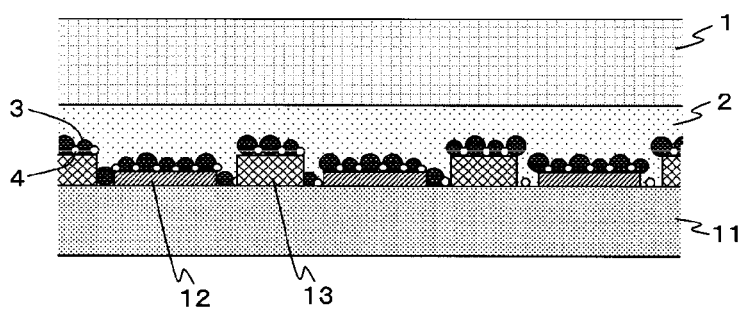

Next, FIGS. 6(*a*)-(*c*) are sectional views that conceptually show a manufacturing method of a solder coating layer to the circuit board electrodes, using the solder transfer substrate 15 in present Embodiment 2.

In the following, the manufacturing method of the solder coating layer to the circuit board electrodes is described using FIG. 6.

As shown in FIG. 6(*a*), on the surface of the circuit board 11 made of silicon, a surface wiring layer is provided which is made of the plural electrode pads 12 that are provided with an arrangement in the form of an area, and wiring (not shown) that links up the electrode pads 12. Moreover, on the surface wiring layer, the solder resist layer 13 is provided with larger diameters compared with the electrode pads 12 so that the electrode pads 12 are exposed to the surface.

For example, the surface wiring layer, the layer thickness of which is 12-18 μm, is made of Cu, and particularly, the electrode pads 12 are, with the diameter being 50 μm, provided with a pitch of 100 μm. For example, the solder resist 13 is made of a photosensitive thermosetting resin, is formed with a layer thickness of 20 μm, and has, conforming to the locations of the electrode pads 12, the opening parts of 60 μm so that the electrode pads 12 are exposed. Moreover, rust-proofing treatment made of a water-soluble preflux material and the like is given on the surfaces of the exposed electrode pads 12 (not shown).

Further, for the solder transfer substrate 15, since the fillers 4, at the time of heating and pressurization, move by pressure and convection of the flux 10, as shown in FIG. 6(*a*), a part of the fillers 4 that have been sprinkled over attaches to the surface of the adhesive layer 2.

Further, the circuit board 11 that is now allowed to be a target of the solder formation corresponds to an example of the work of the present invention.

With respect to the circuit board 11 like this, as shown in FIG. 6(*b*), the solder transfer substrate 15 by present Embodiment 2 is allowed to be loaded so as to face it, and heating and pressurization is performed. In this process, the phenomena to happen are as follows.

Heating and pressurization is accompanied by activation of the flux material 10, as well as softening of the adhesive of the adhesive layer 2. The flux material 10 that has been activated removes the oxide films on the surfaces of the solder powders 3 and the surfaces of the electrode pads 12 of the circuit board 11.

Additionally, when the temperature is raised till the solder powders 3 are melted, the solder powders 3 that have been melted are diffused and start to be joined to Cu with the oxide film being removed. After that, when cooled to the ordinary temperature, the solder being melted solidifies, and intermetallic compounds are formed between the solder powders 3 and the electrode pads 12 made of Cu.

On the other hand, by impregnation of the flux material 10, which has not reacted and are left, in the adhesive layer 2, its bonding strength increases compared with the bonding strength the adhesive layer 2 primarily has and, in comparison with Embodiment 1, the electrode pads 12 are more rigidly anchored to the adhesive layer 2. But, since the many fillers 4 lie between the adhesive layer 2 and the electrode pads 12, the bonding strength lowers, compared with the case where the fillers 4 are not added.

For example, a result of measuring the bonding strength between a flux containing transfer sheet and Cu using 180 degree peel peeling-off test has shown that, while it is 18-23N in a case where the filler content rate is 0%, by adding the fillers 4 of 15%, it can be lowered to 4-6N.

A result of forming, using the solder transfer substrate 15 as in present Embodiment 2, the solder layer on the above-mentioned circuit board 11 shows that, as shown in FIG. 6(*c*), also with respect to the Cu electrode pads 12 whose adhesion force with Si is weak, without peeling the Cu electrode pads 12, the solder layer composed of the plural solder powders 3 can be formed on the electrode pads 12.

Figure 6C:
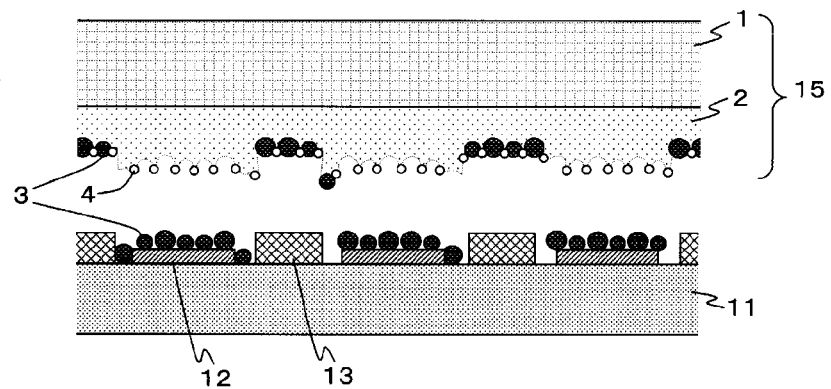

Further, after the solder transfer substrate 15 is peeled off as shown in FIG. 6(c), a second flux material may be supplied on the surface of the circuit board 11, and after that heating in a reflow furnace may be carried out. By adding this step, each of the solder powders 3 is melted, diffused and joined to the electrode pad 12, and the solder layer is formed. At this time, since the fillers 4 do not get wet with the solder powders 3, the fillers 4 are pushed out to the solder surface by convection of the melted solder. After that, when the above-mentioned circuit board 11 is dipped in a solvent or pure-water cistern, and washing is carried out while ultrasonic waves are applied with heating, the fillers 4 on the solder surface are removed along with the second flux material.

As illustrated in the aforementioned, when the solder transfer substrate 15 of present Embodiment 2 is used, also in a fragile electrode pad, solder layers can be surely formed with no pad interface peeling-off caused.

Embodiment 3

Figure 7A:
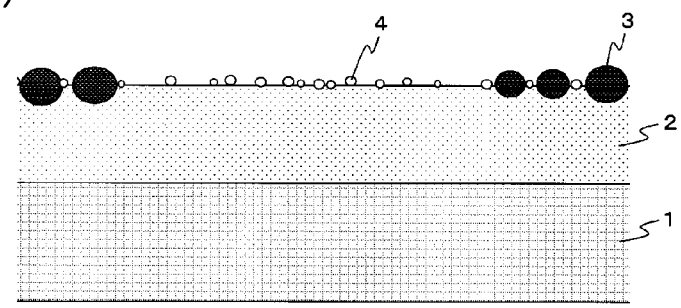
FIG. 7(a) is a sectional view that conceptually shows a solder transfer substrate in Embodiment 3 of the present invention.

FIGS. 7(a) and (b) are a sectional view and a plane view that conceptually show a solder transfer substrate in Embodiment 3 of the present invention.

As is shown in FIG. 7(a), the adhesive layer 2 is provided to the whole area on the base layer 1, and on the adhesive layer 2 are bonded thereto the solder powders 3 and the fillers 4. Now, on the surface of the adhesive layer 2, there exist a region where the solder powders 3 are dense and a region where they are sparse. For example, while on the region where they are dense is 75-85% the filling rate of the solder powders 3, on the region where they are sparse, it is 0-15%.

Figure 7B:
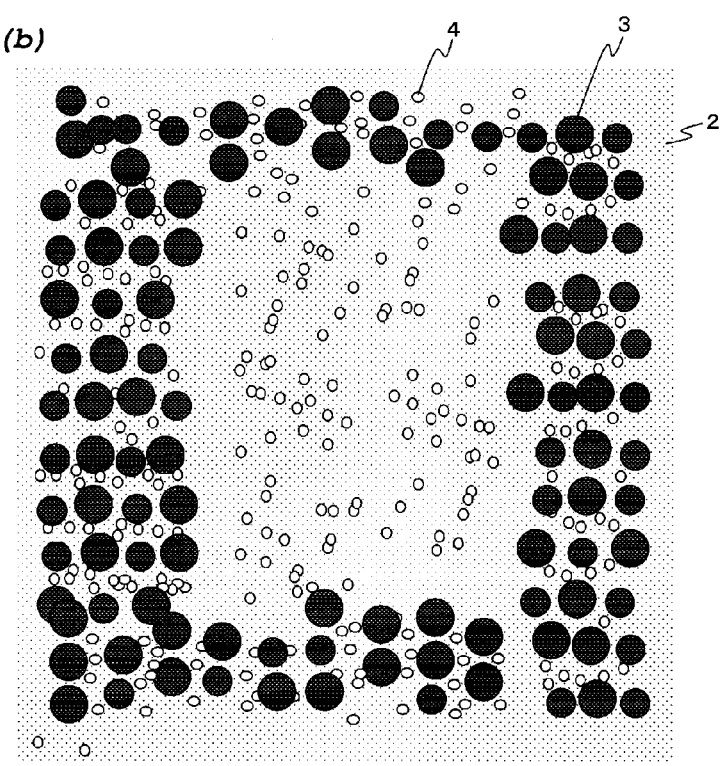
FIG. 7(b) is a plane view that conceptually shows a solder transfer substrate in Embodiment 3 of the present invention.
Figure 8A:
FIGS. 8(a)-(e) are explanatory drawings of the step of performing solder layer formation (precoating) in a conventional embodiment.
Figure 8B:
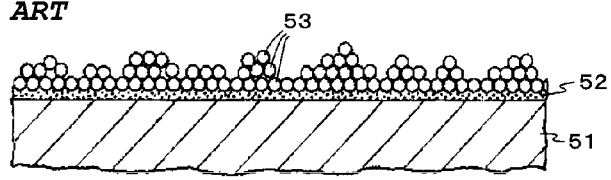
Figure 8C:
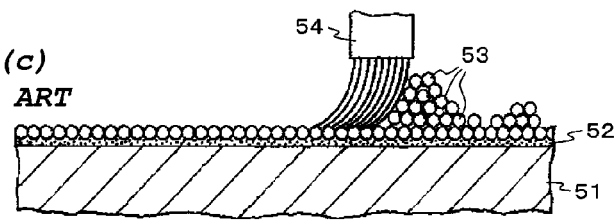
Figure 8D:
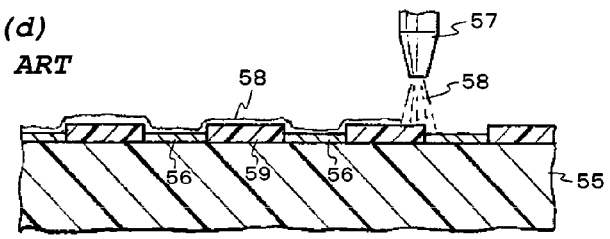
Figure 8E:
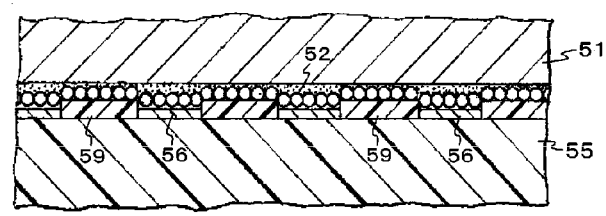
Figure 9A:
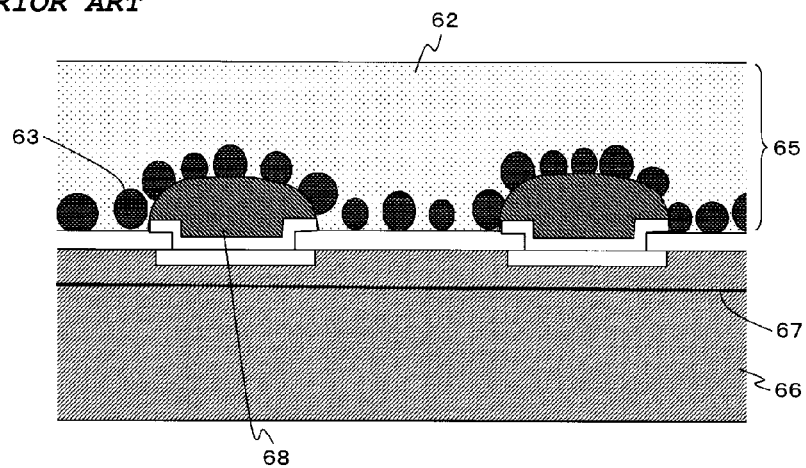
FIGS. 9(a) and (b) show enlarged sectional views that conceptually show the step of forming, by a conventional solder formation technique, solder layers on the electrode terminals on a semiconductor element having a fragile low-dielectric-constant film.
Figure 9B:
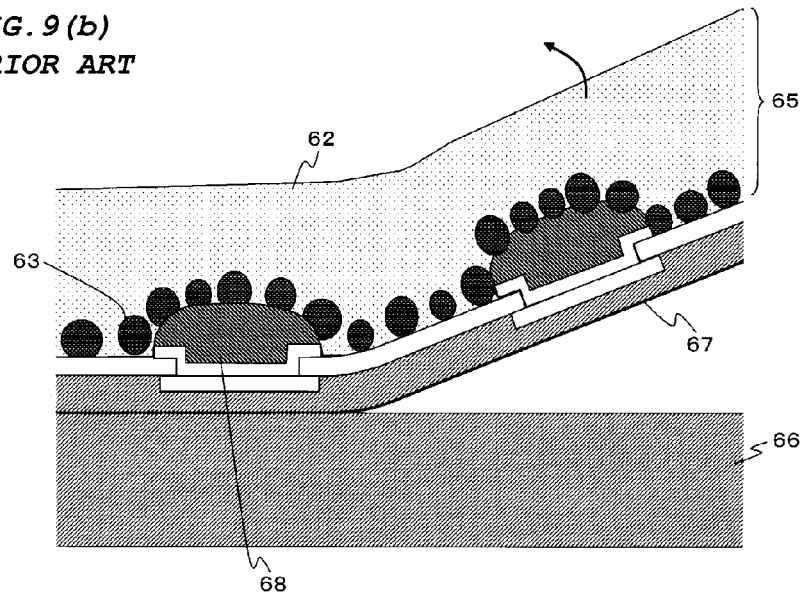

In this example as is shown in FIG. 7(b), planarly, the outer periphery part is the region where the solder powders 3 are dense, and the inner periphery part is the region where they are sparse.

In a case where a solder transfer substrate is applied to a semiconductor element such that one line or two lines of the electrode terminals are arranged on the outer periphery part, solder particles are unnecessary to the inner periphery part where there are no electrode terminals.

In such a case, when the solder transfer substrate of present Embodiment 3 as shown in FIG. 7 is used, with respect to a region where the semiconductor element surface is bonded directly to the adhesive without solder, the peel strength can be lowered, since the bonding area of the semiconductor element surface and the adhesive gets smaller, because the fillers 4 lie between. Since this is accompanied by lowered strength for peeling off the solder transfer substrate, it becomes possible to carry out peeling with lower peeling-off strength also with respect to a portion where the solder powders 3 are located densely.

Further, in the constitution shown in FIG. 7, the peripheral portion of the surface of the adhesive layer 2 of the solder transfer substrate corresponds to an example of the first region of the present invention, and the central portion of the surface of the adhesive layer 2 corresponds to an example of the second region of the present invention.

Further, here, description has been carried out for an example of a semiconductor element such that the electrode terminals are arranged along the four edges of the outer periphery part but, for example, in a case of an application to a semiconductor element such that the electrode terminals are arranged only along the two edges facing each other of the outer periphery part, the solder powders may be densely arranged only in the neighborhood of the two edges facing each other of the surface of the adhesive layer 2 of the solder transfer substrate, and the other portions may be allowed to be the regions where they are sparse. Corresponding to the electrode arrangement of the work such as a semiconductor element or the like as a target, the regions where the solder powders are allowed to be dense and the regions where they are allowed to be sparse may be formed.

Further, in respective embodiments, description has been carried out for examples of a semiconductor element having a fragile low-dielectric-constant film and a circuit board having Cu electrode pads whose adhesion force with respect to Si is weak but, a solder transfer substrate of the present invention and a manufacturing method thereof are, not limited to such constitution, applicable to a semiconductor element, a circuit board or the like having fragile portions on the surface, such as a fragile film or layer, a member liable to peel and the like.

As described in the aforementioned, by the solder transfer substrate of the present invention and the manufacturing method thereof, since the fillers lie between the in-between spaces between the solder powders and on the adhesive, the bonding area between the adhesive and the protruding electrodes gets smaller, the strength between the adhesive and the protruding electrodes is able to be decreased and, since that strength is less than the interface strength under the pads or the destruction strength of the fragile film, also in the step of peeling off the solder transfer substrate, peeling-off of the fragile low-dielectric-constant film under the pads or the electrode pads can be prevented. Moreover, since the fillers always lie between each of the solder powders at the time of solder melting, even if the solder powders are spread all over without in-between spaces so that contiguous powders come in contact with each other, occurrence of solder short-circuit inferiority can be prevented.

By such solder transfer substrates and manufacturing methods thereof, with respect to electronic components such as semiconductor elements and so forth or circuit boards having fragile films such as low-dielectric-constant films, solder layers of appropriate thickness can be surely formed, with no peeling-off and fissures of the fragile films occurred.

Moreover, the solder transfer substrate of the present invention and the manufacturing method thereof are a solder transfer substrate and a manufacturing method thereof characterized in that the fillers lie between the in-between spaces between the solder powders and on the adhesive, and can realize high reliability also in connection of narrow pitch.

INDUSTRIAL APPLICABILITY

A manufacturing method of a solder transfer substrate, a solder precoating method and a solder transfer substrate pertaining to the present invention have an effect of surely forming solder layers of appropriate thickness with respect to electronic components such as semiconductor elements and so forth or circuit boards having fragile portions, and are useful particularly in the mounting field of mounting semiconductor elements with progress in narrow pitch, or semiconductor elements and the like having interlayer insulating films composed of low-dielectric-constant materials and the like.

DESCRIPTION OF SYMBOLS 1 base layer
2 adhesive layer
3 solder powder
4 filler
5 solder transfer substrate 6 semiconductor element
7 low-dielectric-constant film
8 protruding electrode
9 insulating film
10 flux (flux material)
11 circuit board
12 electrode pad
13 solder resist
15 solder transfer substrate
51 support medium
52 adhesive
53 powder solder
54 brush
55 work
56 soldering part
57 spray fluxer
58 liquid flux
59 resist
62 adhesive
63 powder solder
65 solder transfer substrate
66 semiconductor element
67 low-dielectric-constant film
68 protruding electrode

The invention claimed is:

1. A method, which uses a solder transfer substrate manufactured by a manufacturing method that comprises:
   an adhesive layer forming step of forming an adhesive layer on a surface of a substrate;
   a solder layer forming step of dividing the adhesive layer into a first region and a second region and forming a solder layer on the adhesive layer by loading plural solder powders with in-between spaces, so that the solder powders are denser on the first region compared with the second region; and
   a filler supplying step of supplying fillers to the in-between spaces of the solder powders,
   and a solder precoating method comprising:
   a solder joining step of superposing the solder transfer substrate and a work that has a layer with an electrode formed thereon so that a face on which the solder layer is formed faces a face on which the electrode is formed, and carrying out heating and pressurization, thereby allowing the solder powders on the first region to be diffused and joined to the electrode; and
   a transfer substrate peeling-off step of peeling off, after cooling, the solder transfer substrate from the work with the fillers being allowed to become initial points of the peeling-off, wherein
   a melting point of the fillers is higher than a melting point of the solder powders.

2. A method, which uses a solder transfer substrate manufactured by a manufacturing method that comprises:
   an adhesive layer forming step of forming an adhesive layer on a surface of a substrate;
   a solder layer forming step of dividing the adhesive layer into a first region and a second region and forming a solder layer on the adhesive layer by loading plural solder powders with in-between spaces, so that the solder powders are denser on the first region compared with the second region;
   a flux supplying step of supplying a flux so that the solder powders are covered with the flux; and
   a filler supplying step of supplying fillers to the in-between spaces of the solder powders,
   and a solder precoating method comprising:
   a solder joining step of superposing the solder transfer substrate and a work that has a layer with an electrode formed thereon so that a face on which the solder layer is formed faces a face on which the electrode is formed, and carrying out heating and pressurization, thereby allowing the solder powders on the first region to be diffused and joined to the electrode; and
   a transfer substrate peeling-off step of peeling off, after cooling, the solder transfer substrate from the work with the fillers being allowed to become initial points of the peeling-off, wherein
   a melting point of the fillers is higher than a melting point of the solder powders.

* * * * *